United States Patent [19]
Tominaga et al.

[11] Patent Number: 6,078,155
[45] Date of Patent: Jun. 20, 2000

[54] ELECTRIC POWER STEERING CIRCUIT ASSEMBLY

[75] Inventors: Tsutomu Tominaga; Tadayuki Fujimoto, both of Tokyo, Japan

[73] Assignee: Mitsubishi Denki Kabushiki Kaisha, Tokyo, Japan

[21] Appl. No.: 09/322,022

[22] Filed: May 28, 1999

[30] Foreign Application Priority Data

Jan. 18, 1999 [JP] Japan ................................ 11-009701

[51] Int. Cl.[7] ............................. B62D 5/04; H05K 3/30
[52] U.S. Cl. ......................... 318/293; 318/430; 361/690; 361/711; 361/717
[58] Field of Search .................................. 318/138, 139, 318/245, 254, 293, 430–479; 361/23–35, 690, 711, 717, 718, 719, 720, 722, 740, 807; 439/55, 76.2

[56] References Cited

U.S. PATENT DOCUMENTS

| | | |
|---|---|---|
| 3,531,702 | 9/1970 | Hill . |
| 3,539,350 | 11/1970 | Gawron et al. . |
| 4,218,724 | 8/1980 | Kaufman ................................ 361/395 |
| 4,872,102 | 10/1989 | Getter . |
| 4,942,380 | 7/1990 | Bradford et al. ........................ 335/301 |
| 5,012,173 | 4/1991 | Fuyioka et al. . |
| 5,497,289 | 3/1996 | Sugishima et al. . |
| 5,602,451 | 2/1997 | Kohge et al. ........................... 318/293 |

FOREIGN PATENT DOCUMENTS 6-270824  9/1994  Japan .

*Primary Examiner*—Paul Ip
*Attorney, Agent, or Firm*—Sughrue, Mion, Zinn, Macpeak & Seas, PLLC

[57] ABSTRACT

An electric power steering circuit assembly comprises a heat sink, a power circuit board secured in close contact with the heat sink, mounted with large-current parts, and having connecting members erected thereon, a housing mounted with large parts and secured to the heat sink so as to cover the power circuit board, a control circuit board mounted with control components and secured to the housing so as to overlap the power circuit board in the vertical direction, and guides disposed on the housing for receiving the connecting members to position the housing relative to the power circuit board.

10 Claims, 10 Drawing Sheets

ELECTRIC POWER STEERING CIRCUIT ASSEMBLY

BACKGROUND OF THE INVENTION

1. Field of the Invention

The present invention relates to an electric power steering circuit assembly for the auxiliary energizing of an automotive steering assembly by the torque of a motor, and relates in particular to the construction of the circuit.

2. Description of the Related Art

As shown in FIG. 8, an automobile provided with an electric power steering circuit assembly generally comprises: a torque sensor 50 for detecting steering torque from a steering wheel 30; a vehicle speed sensor 51 for detecting the speed of the vehicle; and an electric power steering circuit assembly 100 for making a motor 40 output auxiliary torque in a required direction in response to steering torque and vehicle speed.

FIG. 9 is a circuit diagram for a generic electric power steering circuit assembly showing part thereof as a block diagram.

In FIG. 9, 40 is the motor for outputting auxiliary torque with respect to the steering wheel of an automobile (not shown), and 41 is a battery for supplying a motor current IM to drive the motor 40.

42 is a high-capacitance (approximately 3600 $\mu$F) capacitor for absorbing ripple components in the motor current IM, 43 is a shunt resistor for detecting the motor current IM, 44 is a bridge circuit comprising a plurality of semiconductor switching components Q1 to Q4 (field-effect transistors (FETs), for example) for switching the motor current IM in response to the magnitude and direction of the auxiliary torque, and 49 is a coil for eliminating electromagnetic noise.

L1 is a lead for connecting one end of the capacitor 42 to ground, P1 and P2 are wiring patterns for bridge connection of the semiconductor switching components Q1 to Q4 as well as for connecting the shunt resistor 43 to the bridge circuit 44, and P3 is a wiring pattern constituting an output terminal for the bridge circuit 44.

45 is a connector comprising a plurality of lead terminals for connecting the motor 40 and the battery 41 to the bridge circuit 44, L2 is external wiring for connecting the motor 40 and the battery 41 to the connector 45, 46 is a normally open relay for switching off the motor current IM when necessary, P4 is a wiring pattern for connecting the relay 46, the capacitor 42, and the shunt resistor 43, and P5 is a wiring pattern for connecting the connector 45 to ground. The wiring pattern P3 constituting an output terminal for the bridge circuit 44 is connected to the connector 45.

47 is a drive circuit for activating the motor 40 by means of the bridge circuit 44 as well as for activating the relay 46, L3 is a lead for connecting the drive circuit 47 to the excitation coil of the relay 46, L4 are leads for connecting the drive circuit 47 to the bridge circuit 44, 48 is a motor current detection means for detecting the motor current IM by means of one end of the shunt resistor 43, and the drive circuit 47 and the motor current detection means 48 constitute peripheral circuit components of a microcomputer described below.

50 is a torque sensor for detecting the steering torque T of the steering wheel, and 51 is vehicle speed sensor for detecting the vehicle speed V of the automobile. 55 is a microcomputer (ECU) for calculating the auxiliary torque based on the steering torque T and the vehicle speed V as well as obtaining feeding back concerning the motor current IM to generate a drive signal corresponding to the auxiliary torque, and the microcomputer inputs a rotational direction command DO and a current control variable 10 for controlling the bridge circuit 44 into the drive circuit 47 as a drive signal.

The microcomputer 55 comprises: a motor current determining means 56 for generating a rotational direction command DO for the motor 40 and a motor current command Im corresponding to the auxiliary torque; a subtraction means 57 for calculating the current variance $\Delta I$ between the motor current command Im and the motor current IM; a PID calculating means 58 for calculating compensation for a P (proportional) term, an I (integrated) term, and a D (differential) term, from the current variance $\Delta I$ to generate the current control variable 10 corresponding to the PWM duty ratio.

Furthermore, although not shown, the microcomputer 55 includes a commonly-known self-diagnostic function in addition to an analog-digital converter (ADC), PWM (Pulse-Width Modulation) timer circuit, etc., and continuously diagnoses itself to make sure that the system is operating normally. If an abnormality arises, the relay 46 is opened by means of the drive circuit 47, switching off the motor current IM. L5 are leads for connecting the microcomputer 55 to the drive circuit 47.

Generally, the circuit elements 42 to 44, and 49, the wiring patterns P1 to P5, and the leads L1 and L2 interposed between the motor 40 and the battery 41 are enlarged in order to cope with the large motor current IM out of consideration of heat dissipation (thermal resistance), durability, etc., as described below. On the other hand, the microcomputer 55, the peripheral circuit components including the drive circuit 47 and the motor current detection circuit 48, and the leads L3 to L5, are reduced in size since high density is required to handle the small currents therein.

FIG. 10 is a plan view showing the circuit layout of a generic electric power steering circuit assembly, Q1 to Q4, 42, 43, 45, 46, 49, and 55 corresponding to parts with the same numbers in FIG. 9. In this case, the semiconductor switching components Q1 to Q4 each comprise a pair of FETs coated with resin, the high-capacitance capacitor 42 comprises three capacitors, and the microcomputer 55 consists of a single integrated circuit (IC) chip. Furthermore, in order to avoid complicating the diagram, peripheral circuit components, wiring patterns, leads, etc., have been omitted and only the representative structural elements are shown.

In FIG. 10, 1 is a box-shaped metal frame functioning as both a shield plate and a heat sink, 2 is an insulated printed circuit board mounted on the floor of the metal frame 1, and 3 are heat sinks of aluminum, for example, one side of each of which is joined to an inner surface of the metal frame 1. The circuit elements 42, 43, 46, 49, 55, etc., are each mounted on the insulated printed circuit board 2, and the semiconductor switching components Q1 to Q4 are each joined to the other side of the heat sink 3.

4a to 4e constitute conductor strips corresponding to the wiring patterns P1 to P5, etc., employing conductor strips wider and thicker than those of the wiring patterns on the insulated printed circuit board 2 specifically in order to cope with the large current.

Next, the operation of the conventional electric power steering circuit assembly shown in FIG. 10 will be explained with reference to FIG. 9.

The microcomputer 55 receives information concerning the steering torque T and the vehicle speed V from the torque sensor 50 and the vehicle speed sensor 51, respectively, and obtains feedback input concerning the motor current IM from the shunt resistor 43 to generate a rotational direction command D0 for power steering and a current control variable I0 corresponding to the auxiliary torque, and inputs these into the drive circuit 47 by means of the leads L5.

Under regular driving conditions, the drive circuit 47 closes the normally open relay 46 by a command sent through the lead L3, and when the rotational direction command D0 and the current control variable I0 are input generates a PWM activation signal and applies it to the semiconductor switching components Q1 to Q4 of the bridge circuit 44 by means of the leads L4.

Thus, the motor 40 is driven by the motor current IM supplied from the battery 41 through the external wiring L2, the connector 45, the coil 49, the relay 46, the wiring pattern P4, the shunt resistor 43, the wiring pattern P1, the bridge circuit 44, the wiring pattern P3, the connector 45, and the external wiring L2, outputting the required amount of auxiliary torque in the required direction.

At that time, the motor current IM is controlled to match the motor current command Im by detecting the motor current IM by means of the shunt resistor 43 and the motor current detection means 48 and by feeding this information back to the subtraction means 57 in the microcomputer 55. Furthermore, the motor current IM contains ripple components due to the switching operation of the bridge circuit 44 during activation of the PWM, but these are smoothed and controlled by the high-capacitance capacitors 42. In addition, the coil 49 prevents noise generated by the switching operation of the bridge circuit 44 during activation of the PWM from being externally emitted and becoming radio noise.

The value of the motor current IM controlled by an electric power steering circuit assembly of this kind is approximately 25 A even in a light automobile, and may reach approximately 60 to 80 A in a small automobile. Consequently, it is necessary to suppress generation of heat by the semiconductor switching components Q1 to Q4 constituting the bridge circuit 44 while switched on and during switching of the PWM by enlarging the components to cope with the magnitude of the motor current IM as well as connecting a plurality thereof in parallel as shown.

Furthermore, the heat sink 3 is required in order to dissipate the heat generated by the semiconductor switching components Q1 to Q4, and the greater the motor current IM, the greater the number of semiconductor switching components Q1 to Q4 required, requiring that the heat sink 3 be enlarged accordingly.

In addition, the lengths of the wiring patterns P1, P2, and P4 from the terminals of the connector 45 to ground via the coil 49, the relay 46, the shunt resistor 43 and the bridge circuit 44, and the length of the wiring pattern P3 from the bridge circuit 44 to the motor 40 physically increase in proportion to increases in the motor current IM, increases in the number of semiconductor switching components Q1 to Q4, and enlargement of the heat sink.

As a result, in a conventional electric power steering circuit assembly, thick, wide conductor strips 4a to 4e specifically designed for large currents are used, as shown in FIG. 10, because there is a risk that the wiring patterns P1 to P4 will lose thermal resistance and durability if temperatures increase dramatically due to heat generated as result of voltage drops in each of the wiring patterns P1 to P4. This consequently leads to enlargement of the insulated printed circuit board 2.

Furthermore, the capacitors 42, the shunt resistor 43, the relay 46, and the coil 49 are enlarged because of increases in the motor current IM, and attempting to mount these on the insulated printed circuit board 2 leads to further enlargement of the insulated printed circuit board 2 to provide mounting space.

SUMMARY OF THE INVENTION

The present invention aims to solve the above problems and an object of the present invention is to provide an electric power steering circuit assembly capable of achieving reductions in size by dividing the circuit board for the mounting of parts into two boards comprising a board for the mounting of small-current parts and a board for the mounting of large-current parts, as well as enabling facilitation of assembly by adopting positioning mechanisms among the boards and a housing for mounting large parts wherein the two boards are arranged above and below with the housing between.

In order to achieve the above object, according to one aspect of the present invention, there is provided an electric power steering circuit assembly comprising:

a motor for outputting an auxiliary torque to a steering wheel of an automobile;

a battery for supplying a motor current to drive the motor;

a torque sensor for detecting the steering torque of the steering wheel;

a vehicle speed sensor for detecting the vehicle speed of the automobile;

a power circuit board mounted with a bridge circuit comprising a plurality of semiconductor switching components for switching the motor current according to the required auxiliary torque;

a housing having conductor strips insert-molded in insulating resin to form wiring patterns, having a connector for electrical connection to the motor and the battery formed integrally therein, and being mounted with capacitors for absorbing ripple components in the motor current, a coil for preventing the external emission of noise generated by the bridge circuit during the switching operation, a power source relay for connecting and disconnecting the motor current supplied from the battery to the bridge circuit, and a motor relay for connecting and disconnecting the motor current supplied from the bridge circuit to the motor;

a control circuit board mounted with a microcomputer and peripheral circuit components for generating a drive signal for controlling the bridge circuit based on the steering torque of the steering wheel and the vehicle speed of the automobile;

a connecting members disposed in an upright position on the power circuit board having a plurality of terminals for the electrical connection of the power circuit board to the housing and to the control circuit board; and a heat sink, the electric power steering circuit assembly having a layered construction such that the power circuit board is secured in close contact to the heat sink, the housing is secured to the heat sink so as to cover the power circuit board, and the control circuit board is secured to the housing so as to overlap the power circuit board in a vertical direction, and having guides formed in the housing for receiving the connecting members and positioning the housing relative to the power circuit board.

DETAILED DESCRIPTION OF THE PREFERRED EMBODIMENTS

The preferred embodiments of the present invention will now be explained with reference to the drawings.

Embodiment 1

Figure 1:
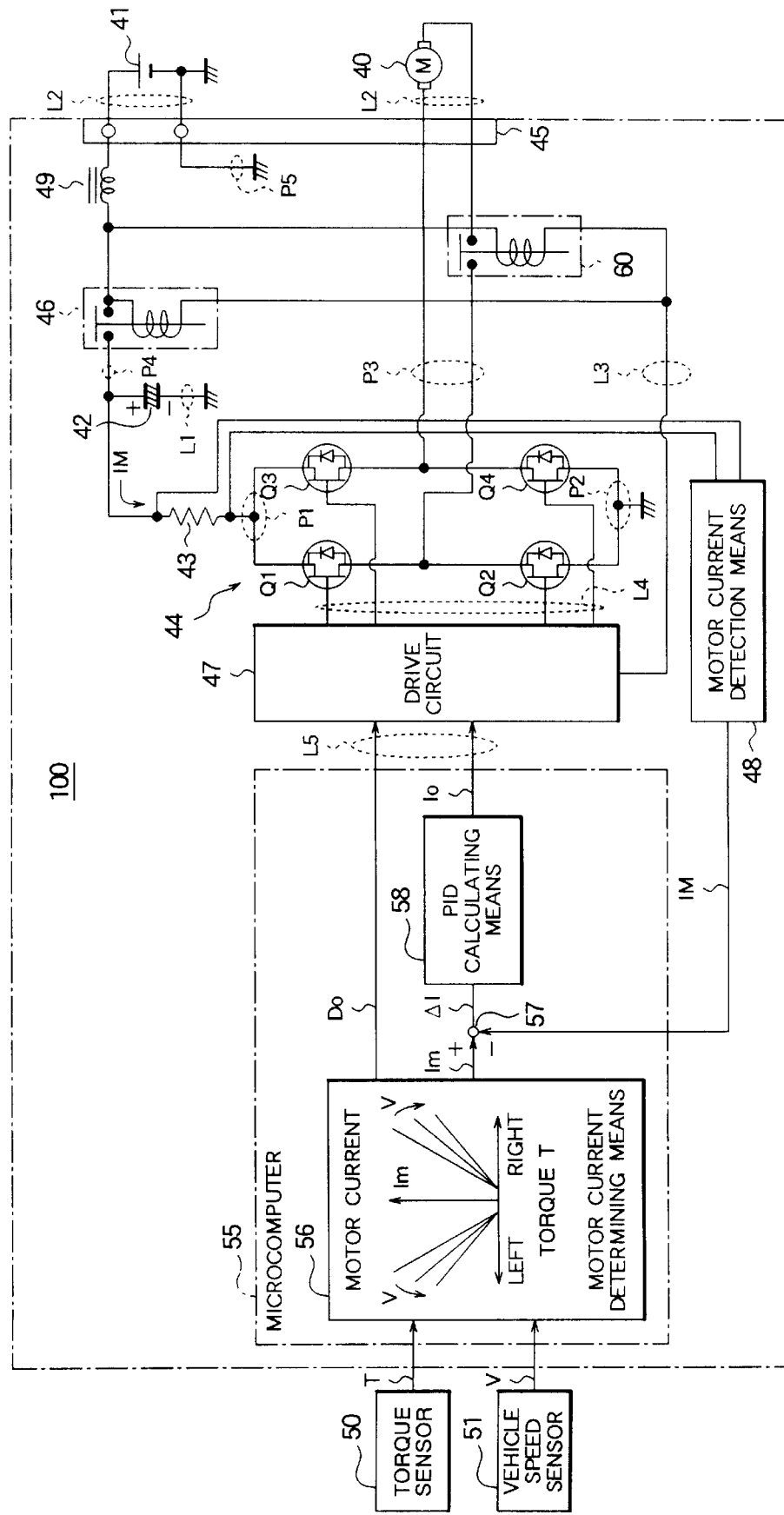
FIG. 1 is a partial block diagram of an electric power steering circuit assembly according to Embodiment 1 of the present invention.

FIG. 1 is a partial block diagram of an electric power steering circuit assembly according to Embodiment 1 of the present invention, and parts the same as or corresponding to those of the conventional circuit assembly shown in FIG. 9 will be given the same numbering and explanations thereof will be omitted.

In FIG. 1, a motor relay 60 for connecting and disconnecting the motor current is disposed between the motor 40 and the drive circuit 47. The circuit elements 42 to 44, 46, 49, and 60, the wiring patterns P1 to P5, and the leads L1 and L2 interposed between the motor 40 and the battery 41 are enlarged in order to cope with the large motor current IM out of consideration of heat dissipation, durability, etc. On the other hand, the microcomputer 55, the peripheral circuit components including the drive circuit 47 and the motor current detection circuit 48, and the leads L3 to L5, are reduced in size since high density is required to handle the small currents therein.

Figure 9:
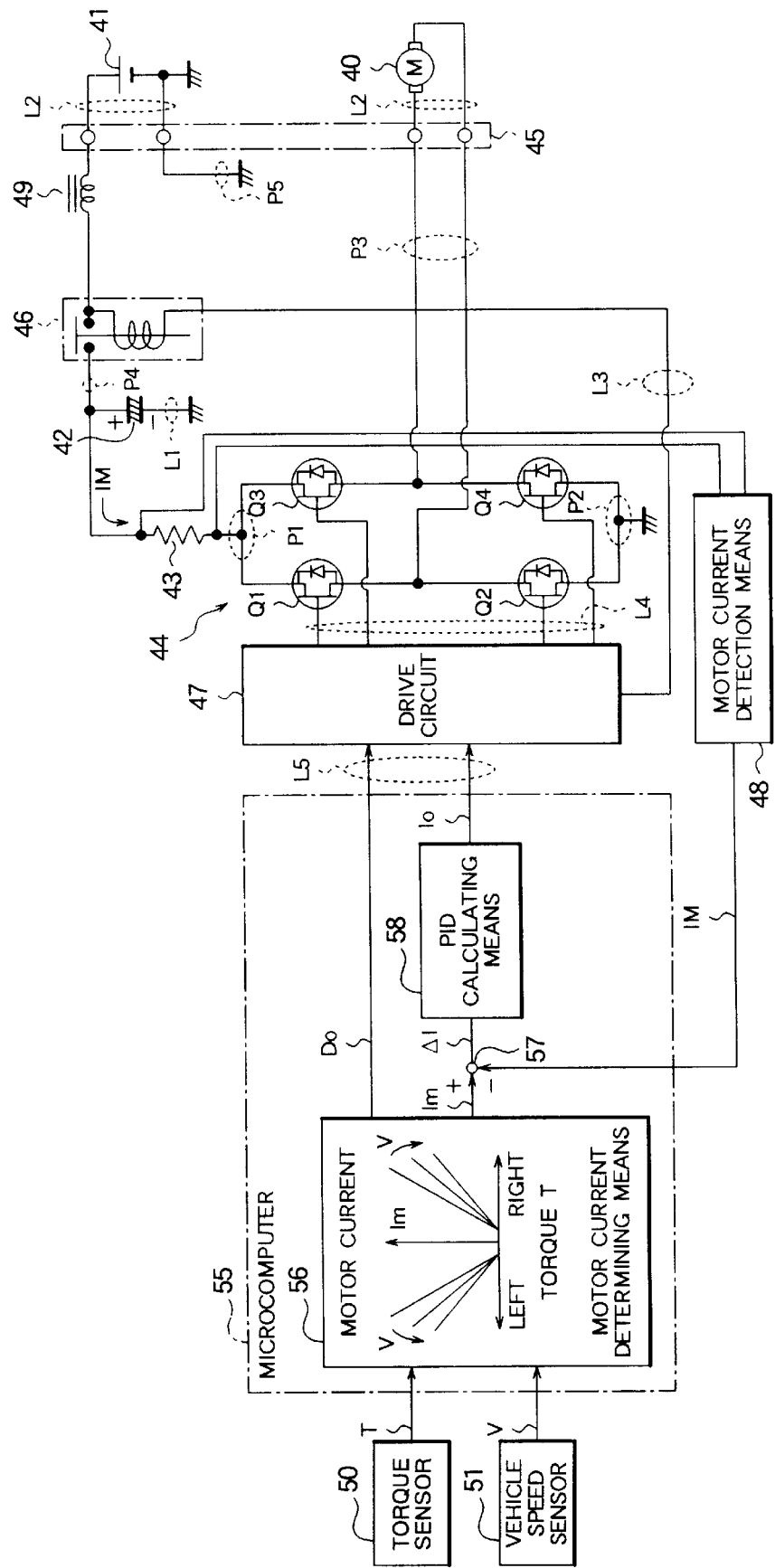
FIG. 9 is a circuit diagram for a generic electric power steering circuit assembly showing part thereof as a block diagram.
Figure 10:
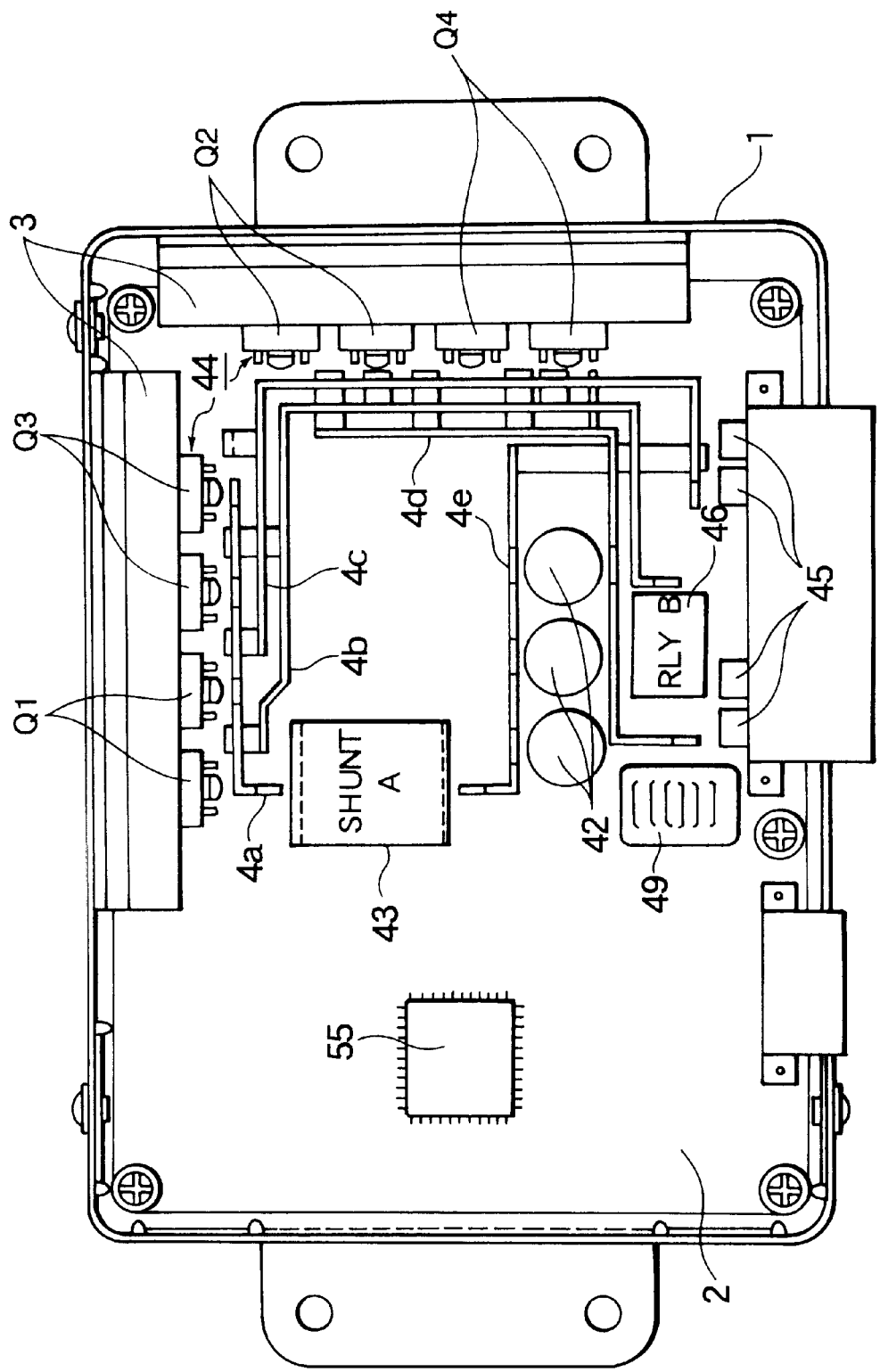
FIG. 10 is a plan view showing the circuit layout of a generic electric power steering circuit assembly.

Moreover, since the rest of the circuit layout is the same as for the conventional circuit assembly shown in FIG. 9 and the operation thereof is also the same, detailed explanations thereof will be omitted here.

Figure 2:
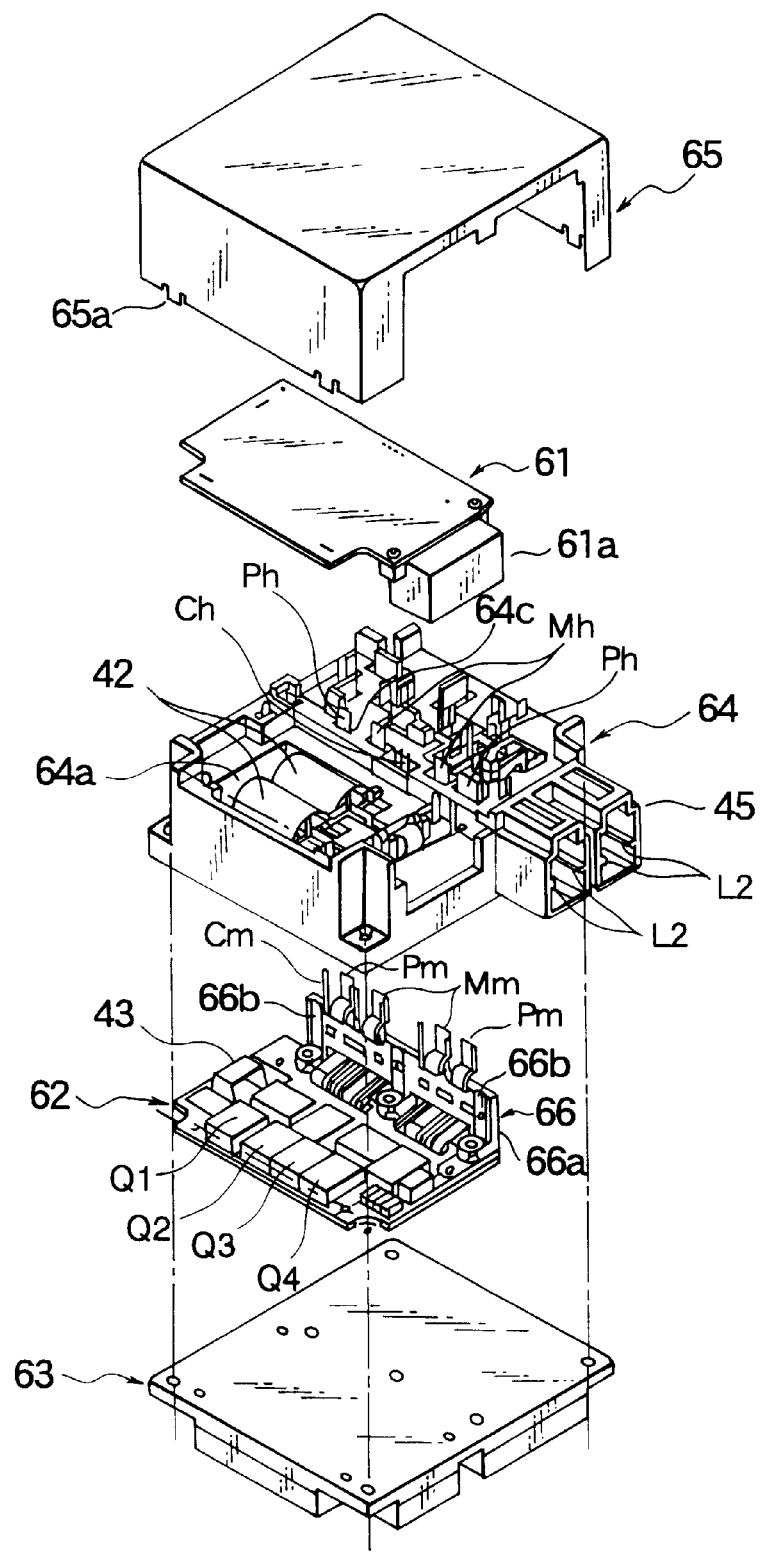
FIG. 2 is an exploded perspective view of an electric power steering circuit assembly according to Embodiment 1 of the present invention.
Figure 3:
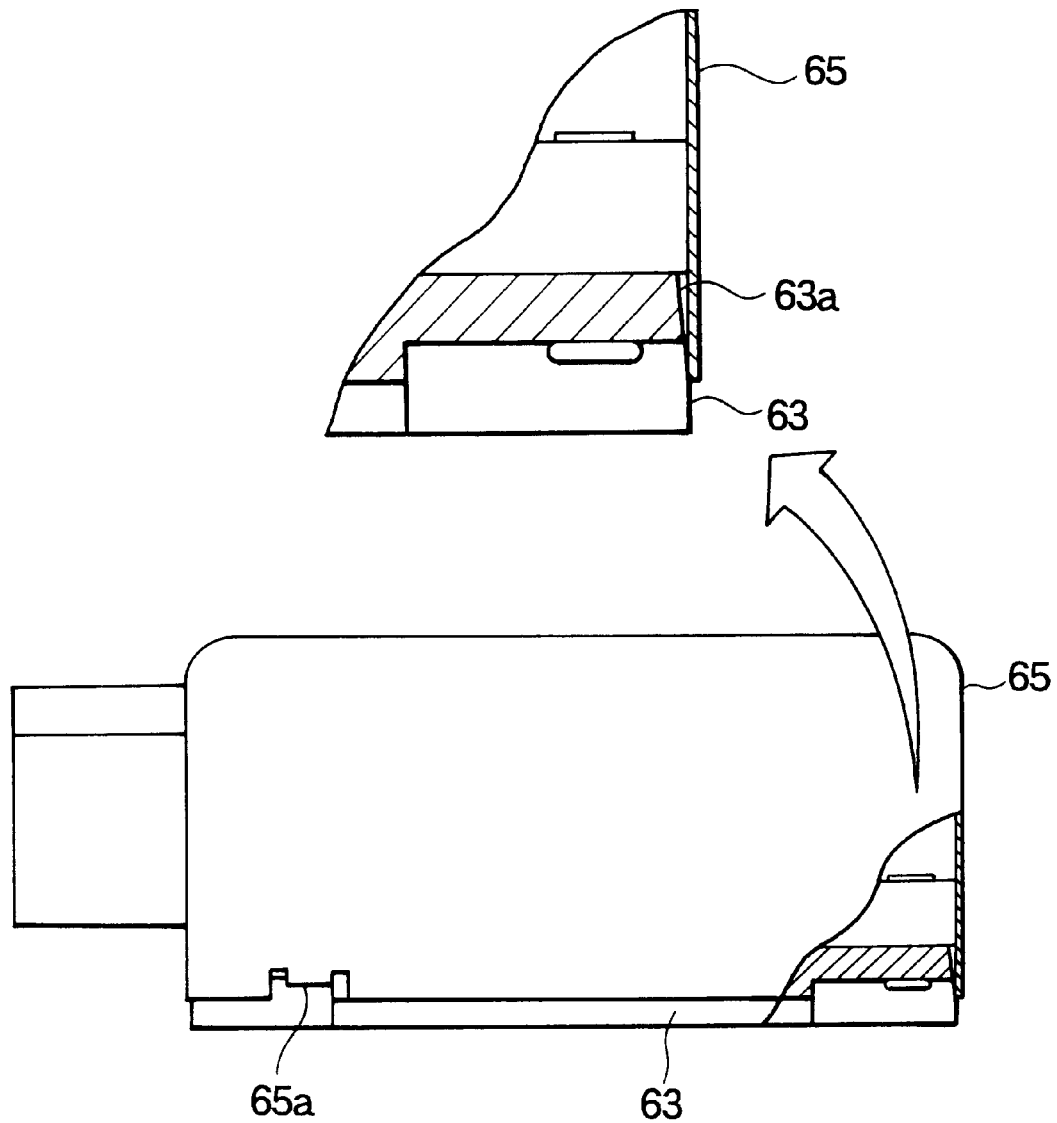
FIG. 3 is a partially cut-away side elevation of an electric power steering circuit assembly according to Embodiment 1 of the present invention.
Figure 4:
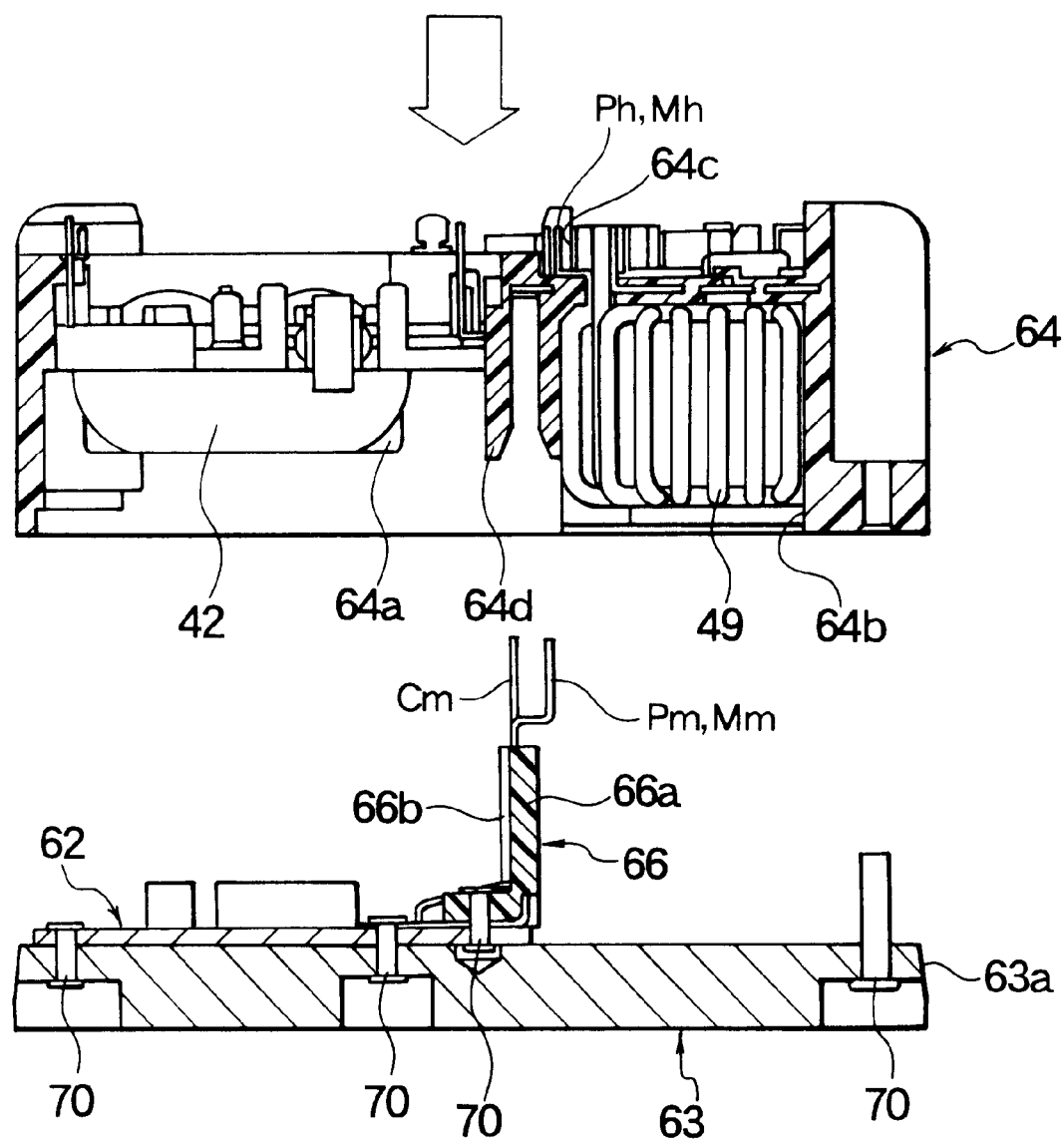
FIG. 4 is a cross-sectional view explaining the method of mounting a housing in an electric power steering circuit assembly according to Embodiment 1 of the present invention.
Figure 5:
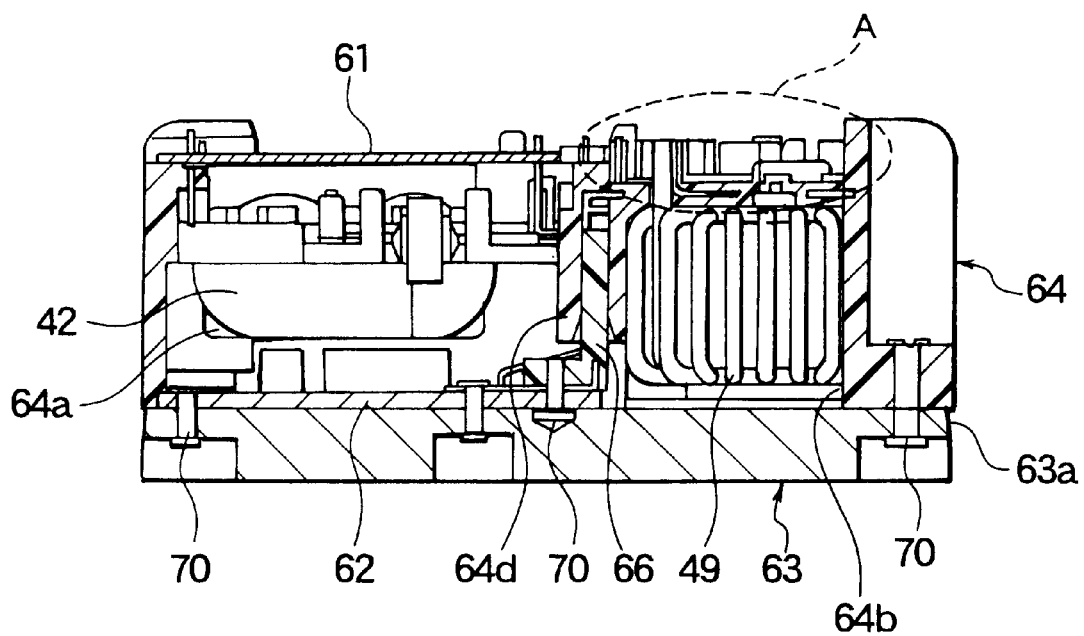
FIG. 5 is a cross-sectional view showing an electric power steering circuit assembly according to Embodiment 1 of the present invention before the mounting of a case.

FIG. 2 is an exploded perspective view of an electric power steering circuit assembly according to Embodiment 1 of the present invention, FIG. 3 is a partially cut-away side elevation of an electric power steering circuit assembly according to Embodiment 1 of the present invention, FIG. 4 is a cross-sectional view explaining the method of mounting a housing in an electric power steering circuit assembly according to Embodiment 1 of the present invention, and FIG. 5 is a cross-sectional view showing an electric power steering circuit assembly according to Embodiment 1 of the present invention before the mounting of a case.

In FIGS. 2 to 5, a control circuit board 61 is composed of an insulated printed circuit board. The microcomputer 55 and the peripheral circuit components including the drive circuit 47 and the motor current detection circuit 48 (small-current parts) are mounted and soldered onto the wiring patterns (L3 to L5, etc.) on the control circuit board 61. In addition, a sensor signal connector 61a is disposed on the control circuit board 61, whereby information concerning steering torque T and vehicle speed V from the torque sensor 50 and the vehicle speed sensor 51 is input into the microcomputer 55.

A metal circuit board 62 functioning as a power circuit board is composed of HITT circuit board (DENKI KAGAKU KOGYO K.K. trade name), for example, has an outer shape generally matching that of the control circuit board 61, and has wiring patterns (P1 to P4, etc.) formed thereon as a 10 $\mu$m copper pattern on an 80 $\mu$m insulating layer on a 3 mm aluminum circuit board. The heat dissipation function of the metal circuit board 62 is increased by mounting the reverse side thereof on a heat sink 63 so as to be in close contact with approximately half of one side of the heat sink 63. Furthermore, the large-current parts such as the semiconductor switching components Q1 to Q4 constituting part of the bridge circuit 44, the shunt resistor 43, etc., are mounted and soldered onto the wiring patterns (P1 to P4, etc.) on the metal circuit board 62. The wiring patterns formed on the metal circuit board 62 have sufficient cross-sectional area to handle the large current, enabling the mounting of the circuit elements through which the motor current IM flows.

A housing 64 has an outer shape generally matching that of the heat sink 63, has the connector 45 formed integrally therein so as to project from a side thereof, and is mounted on the heat sink 63 so as to cover the metal circuit board 62. In addition, the control circuit board 61 is mounted on one side of the housing 64 so as to overlap the metal circuit board 62 in a vertical direction.

The housing 64 comprises conductor strips insert-molded into insulating resin and has: a recess 64a for housing the capacitors having an opening on the upper surface side and a recess 64b for housing the coil having an opening on the lower surface side disposed side by side in the horizontal direction; a plurality of apertures 64c disposed between the two recesses 64a, 64b so as to pass through in the vertical direction; guides 64d for receiving connecting members described below disposed so as to point downwards; and the connector 45 disposed so as to project from the side of one of the recesses 64b. The conductor strips are partially connected in parts other than the wiring patterns, and are insert-molded in insulating resin such that the partially-connected redundant portions are exposed, the exposed redundant portions are then cut (tie bar cut) to form a wiring pattern for the connection of circuit elements such as the relays 46, 60, the capacitors 42, the coil 49, etc., interposed between the motor 40 and the battery 41. Furthermore, parts of this wiring pattern are exposed to form electrodes for the connection of the terminals of the above circuit elements, and other parts extend into the connector 45 to form the leads L2. In addition, parts of the wiring pattern are exposed within the apertures 64c to form connection terminals Ch, and the housing-side power terminals Ph and motor terminals Mh. Moreover, at least the electrodes for the connection of the terminals of the relays 46, 60, the connection terminals Ch, the power terminals Ph, and the motor terminals Mh are disposed in positions which do not overlap the control circuit board 61 in the vertical direction.

Next, the capacitors 42 are housed in one of the recesses 64a and welded to the exposed electrodes, and the power relay 46, the motor relay 60, and the coil 49 are housed in the other recess 64b and welded to the exposed electrodes therein.

A case 65 is made of iron and is mounted on the heat sink 63 so as to cover the metal circuit board 62, the housing 64, and the control circuit board 61. As shown in FIG. 3, the edges of the heat sink 63 are formed into inclined surfaces 63a (case receiving portions) tapered to widen out from top to bottom, the bottom edges of the case 65 being guided and gradually spread open by the inclined surfaces 63a so as to be mounted on the heat sink 63 in a press-fit condition, whereupon the case 65 is secured to the heat sink 63 by caulking caulking tabs 65a.

Connecting members 66 are formed by insert-molding a plurality of leads and conductor strips into insulating resin, the plurality of leads and conductor strips extending beyond the vertical edges of a generally rectangular parallelepiped resin body 66a to form connection terminals Cm, and the metal circuit board-side power terminals Pm and motor terminals Mm. Furthermore, insert portions 66b for insertion into the guides 64d of the housing 64 are formed in the resin body 66a.

The connecting members 66 are mounted in upright positions along the edge of the metal circuit board 62 located in the middle of the heat sink 63, the lower ends of the connection terminals Cm, and the metal circuit board-side power terminals Pm and motor terminals Mm being soldered to the wiring patterns on the metal circuit board 62. When the housing 64 is being mounted onto the heat sink 63, the guides 64d fit over the insert portions 66b of the connecting members 66 and position the housing 64 relative to the heat sink 63, the upper ends of the connection terminals Cm, and the metal circuit board-side power terminals Pm and motor terminals Mm each being inserted through the apertures 64c in the housing 64. At this point, the upper ends of the metal circuit board-side power terminals Pm and motor terminals Mm pair up with the housing-side power terminals Ph and motor terminals Mh within each of the apertures 64c and are integrated by welding. The connecting terminals Cm, Ch extend from the apertures 64c, and when the control circuit board 61 is being mounted, the connecting terminals Cm, Ch are each inserted through holes in the control circuit board 61 and soldered. Thus, each of the parts mounted on the control circuit board 61, the metal circuit board 62, and the housing 64 are electrically connected to the battery 41 and the motor 40 by means of the connector 45.

In order to assemble an electric power steering circuit assembly constructed in this manner, each of the electrodes on the control circuit board 61 is first coated with cream solder and parts such as the microcomputer 55 and its peripheral circuit components, etc., are arranged thereupon, then a reflow device is used to heat the control circuit board 61 from below, or the ambient atmosphere as a whole, to melt the cream solder and solder the parts to the control circuit board 61. Similarly, each of the electrodes on the metal circuit board 62 is coated with cream solder and parts such as the semiconductor switching components Q1 to Q4, the shunt resistor 43, etc., are arranged thereupon, then the connecting members 66 are erected on the metal circuit board 62 and secured by rivets 70 and a reflow device is used to melt the cream solder and solder the parts to the metal circuit board 62. Next, the metal circuit board 62 mounted with the connecting members 66 is secured by rivets 70 to the heat sink 63.

Furthermore, the capacitors 42 are housed in one of the recesses 64a and joined to the exposed electrodes therein by welding or robotic soldering, and the power relay 46, the motor relay 60, and the coil 49 are housed in the other recess 64b and joined to the exposed electrodes therein by welding or robotic soldering, whereby each of these parts are mounted on the housing 64.

Next, the housing 64 is placed on the heat sink 63 from above so as to cover the metal circuit board 62 and secured by rivets 70. At this time, because the guides 64d of the housing 64 fit over the insert portions 66b of the connecting members 66 as the housing 64 is placed on the heat sink 63, as shown in FIG. 4, the housing 64 is positioned relative to the metal circuit board 62. Thus, the upper ends of the metal circuit board-side connecting terminals Cm, power terminals Pm and motor terminals Mm are each inserted smoothly into the apertures 64c of the housing 64.

Next, the control circuit board 61 is placed on the housing 64 as shown in FIG. 5. At this time, the connecting terminals Cm, Ch on the housing side and the metal circuit board side are each inserted through holes in the control circuit board 61. Then, the connecting terminals Cm, Ch are joined to the electrodes of the control circuit board 61, and the power terminals Ph, Pm and the motor terminals Mh, Mm are joined to each other by welding or robotic soldering.

Next, the case 65 is mounted on the heat sink 63 so as to cover the metal circuit board 62, the housing 64, and the control circuit board 61. At this time, as shown in FIG. 3, the bottom edges of the case 65 are guided and gradually spread open by the inclined surfaces 63a so as to be mounted on the heat sink 63 in a press-fit condition, then the case 65 is secured to the heat sink 63 by caulking the tabs 65a, completing the circuit assembly. By surrounding the metal circuit board 62, the housing 64, and the control circuit board 61 with the case 65, malfunction of the assembly due to electromagnetic noise is prevented, improving the reliability of the assembly.

Thus, according to Embodiment 1, because only the small-current parts such as the microcomputer 55 and its peripheral circuit components, etc., are mounted on the control circuit board 61, there is no need to increase the width or thickness of the wiring patterns and the parts can be mounted to a high density, enabling the circuit board to be reduced in size.

Because the large-current parts such as the semiconductor switching components Q1 to Q4, the shunt resistor 43, etc., are mounted on the metal circuit board 62, and the metal circuit board 62 is mounted in close contact with the heat sink 63, the heat generated by the large-current parts and the wiring patterns is efficiently transmitted through the metal circuit board 62 to the heat sink 63 and dissipated to the outside air by the heat sink 63, enabling temperature increases to be suppressed even if the metal circuit board 62 is reduced in size, as well as ensuring that the wiring patterns do not lose thermal resistance or durability.

Because the large parts such as the capacitors 42, the connector 45, the relays 46, 60, the coil 49, etc., which require a lot of mounting space and are therefore difficult to mount on the metal circuit board 62, are mounted on the housing 64 positioned in an intermediate layer between the control circuit board 61 and the metal circuit board 62 and are electrically connected to the terminals of the connecting members 66 erected on the metal circuit board 62, the degree of freedom in designing the layout between the wiring patterns on the metal circuit board 62 and terminals of the capacitors 42 and the relays 46, 60 is increased, enabling the length of the wiring to be effectively shortened and made more compact. Furthermore, because the control circuit board 61 and the metal circuit board 62 are also disposed above and below the housing 64, the space occupied is effectively reduced, enabling a reduction in size.

Because insert portions 66b are disposed on the connecting members 66 erected on the metal circuit board 62 and guides 64d are disposed on the housing 64, positioning among the heat sink 63, the metal circuit board 62, and the housing 64 is performed by the fitting together of the insert portions 66b and the guides 64d during mounting of the housing 64, facilitating assembly by enabling the upper ends of the connecting terminals Cm, power terminals Pm and motor terminals Mm on the connecting members 66 each to be inserted smoothly into the apertures 64c of the housing 64.

Because the metal circuit board 62 and the housing 64 are separately secured to the heat sink 63, the step of mounting the housing 64 on the heat sink 63 can be performed after the step of mounting parts on the metal circuit board 62. Thus, the parts mounted on the metal circuit board 62 can be easily inspected, improving reliability.

Because the step of mounting parts on the metal circuit board 62 and the control circuit board 61 (a reflow process) and the step of mounting parts on the housing (a welding or robotic soldering process) can be performed separately, productivity can be increased.

Because the sides of the heat sink 63 are formed into inclined surfaces 63a, the bottom edges of the case 65 are guided and gradually spread open by the inclined surfaces 63a as the case 65 is press fit onto the heat sink 63. Thus, the mounting of the case 65 onto the heat sink 63 is improved, and rattling is eliminated suppressing the generation of noise due to vibrations.

Because the capacitors 42 are disposed between the control circuit board 61 and the metal circuit board 62, a wide space is obtained in the horizontal direction for mounting the capacitors 42, allowing long capacitors 42 so as to be mounted sideways, reducing the height of the circuit assembly and enabling a reduction in size.

Because the electrodes in the housing 64 for connection to the relay 46, 60, the power terminals Ph, and the motor terminals Mh are disposed in positions which do not overlap the control circuit board 61 in the vertical direction, as indicated by the dotted line A in FIG. 5, there is no need to provide insulating space in the vertical direction in order to ensure insulation of the control circuit board 61 from the connections between the terminals of the relays 46, 60 and the electrodes of the housing 64 or from the connections between the power terminals Ph, Pm or the motor terminals Mh, Mm, enabling a reduction in height.

Moreover, HITT circuit board was used for the metal circuit board 62, but the metal circuit board 62 is not limited to HITT circuit board, and any circuit board in which wiring patterns are formed on an insulating layer on a metal base such as aluminum may be used. Furthermore, the power relay 46 or the motor relay 60 may be used alone.

Embodiment 2

Figure 6:
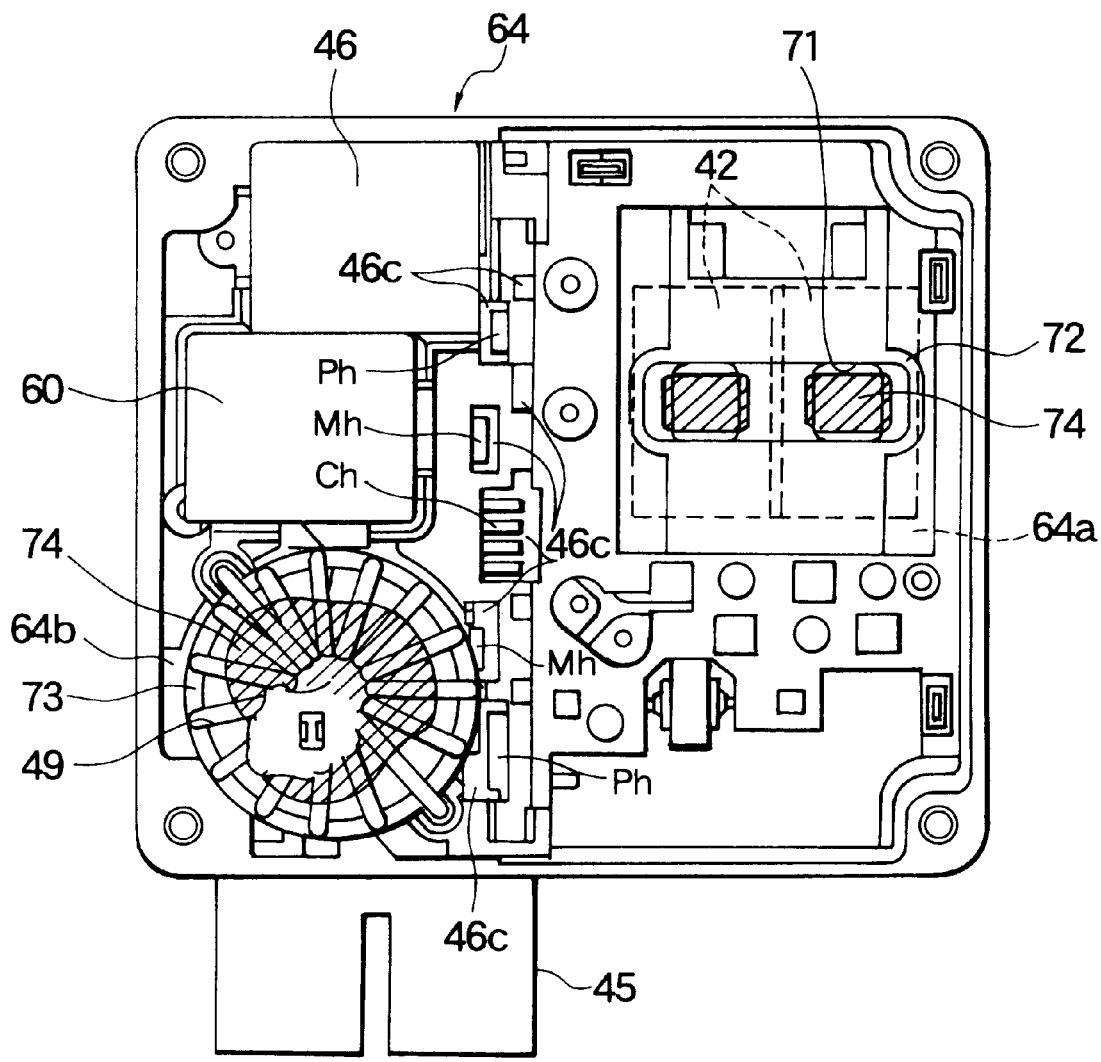
FIG. 6 is a bottom view showing parts mounted in a housing in an electric power steering circuit assembly according to Embodiment 2 of the present invention.

FIG. 6 is a bottom view showing parts mounted in a housing in an electric power steering circuit assembly according to Embodiment 2 of the present invention.

In FIG. 6, the recess 64a having an opening on the upper surface side and the recess 64b having an opening on the lower surface side are disposed side by side in the horizontal direction in the housing 64. Apertures 71 are disposed in the bottom of the recess 64a, and an annular protrusion 72 is disposed on the lower surface of the housing 64 so as to surround the apertures 71. In addition, an annular protrusion 73 is disposed in the bottom of the recess 64b housing the coil 49 so as to surround the coil 49. The coil 49 is disposed in the vicinity of the connector 45 of the housing 64. The shaded portion of the figure is adhesive 74.

Moreover, the rest of the construction is the same as for Embodiment 1 above.

In Embodiment 2, because the recess 64a housing the capacitors 42 and the recess 64b housing the coil 49 are formed with openings facing in opposite directions, and apertures 71 are disposed in the bottom of the recess 64a, the capacitors 42 and the coil 49 are inserted into the recesses 64a, 64b from opposite sides, and then adhesive 74 is injected into the recess 64a from the lower surface side of the housing 64 through the apertures 71, and adhesive 74 is poured between the recess 64b and the coil 49 from the lower surface side of the housing 64, and the adhesive is hardened. Thus, the capacitors 42 and the coil 49 are temporarily secured to the housing 64 by adhesive 74, then the terminals of the capacitors 42 and the coil 49 are joined to the electrodes of the wiring patterns by welding or robotic soldering.

According to Embodiment 2, since the capacitors 42 and the coil 49 are temporarily secured to the housing 64, the adhesive 74 can be applied from the lower surface side of the housing 64, that is from one side, and therefore there is no need to turn the housing 64 over during application, facilitating the operation of temporarily securing the capacitors 42 and the coil 49.

Because the capacitors 42 and the coil 49 are temporarily secured, the capacitors 42 and the coil 49 do not fall out while being connected by welding or robotic soldering, facilitating the connection operation.

Because the protrusions 72 are disposed on the lower surface of the housing 64 so as to surround the apertures 71, the protrusions 72 stop the applied adhesive 74 from running, improving the operation of applying the adhesive 74.

In addition, because the protrusions 73 are disposed on the bottom of the recess 64b housing the coil 49 so as to surround the coil 49, the protrusions 73 stop the applied adhesive 74 from running, improving the operation of applying the adhesive 74.

Embodiment 3

Figure 7:
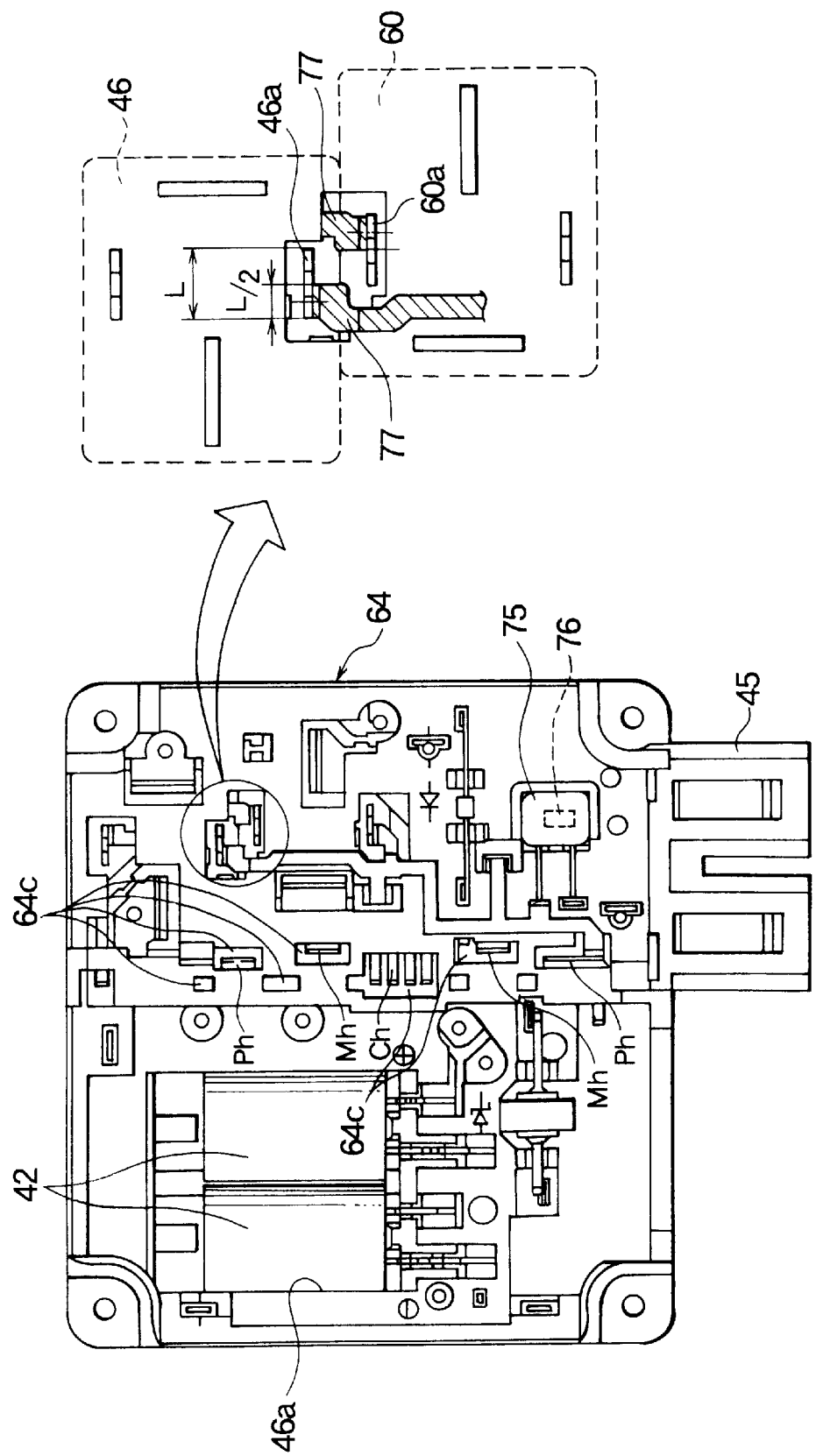
FIG. 7 is a top plan view showing parts mounted in a housing in an electric power steering circuit assembly according to Embodiment 3 of the present invention.
Figure 8:
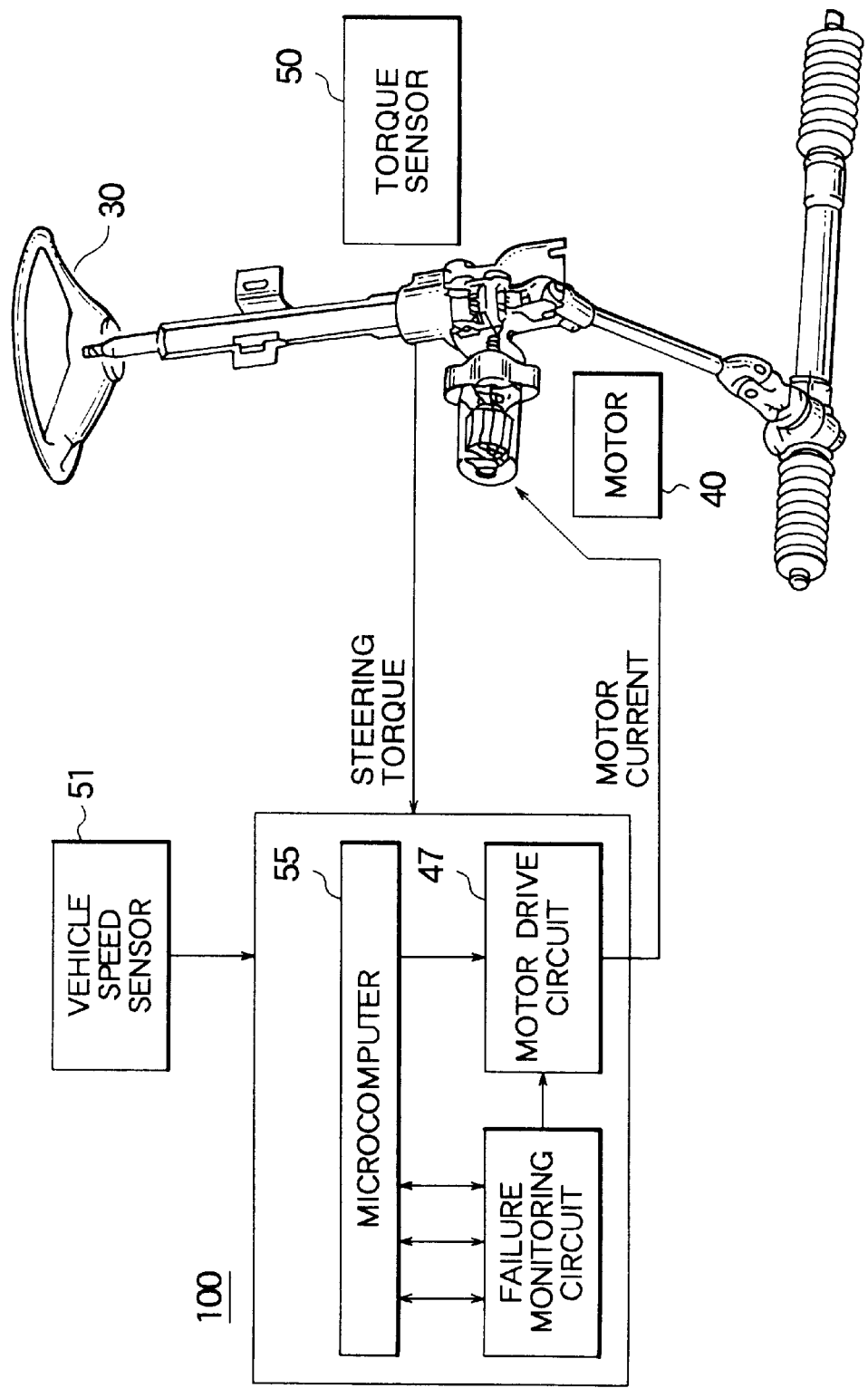
FIG. 8 is a system block diagram for an automobile mounted with a generic electric power steering circuit assembly.

FIG. 7 is a top plan view showing parts mounted in a housing in an electric power steering circuit assembly according to Embodiment 3 of the present invention.

In FIG. 7, a capacitor 75 for preventing electrical noise is mounted on the upper surface of the housing 64 opposite the coil 49 housed in the recess 64b for housing the coil 49, and exposed and cut redundant portions 76 of the conducting strips insert-molded into insulating resin are disposed in a portion between the coil 49 and the capacitor 75. Furthermore, the power relay 46 and the motor relay 60 are disposed side by side adjacent to each other within the recess 64b, being offset by half the width of the coil terminals 46a, 60a of the relays 46, 60. The width of the electrodes 77 of the conducting strips of the housing 64 for electrical connection of the coil terminals 46a, 60a are formed to half the width of the coil terminals 46a, 60a.

Moreover, the rest of the construction is the same as for Embodiment 2 above.

In Embodiment 3, because the redundant portions 76 are covered by the capacitor 75, the adhesive 74 poured between the recess 64b and the coil 49 from the lower surface side of the housing 64 does not run over to the upper surface side from the redundant portions 76, improving the operation by preventing adhesive 74 from adhering to unnecessary portions.

Because the power relay 46 and the motor relay 60 are offset by half the width of the coil terminals 46a, 60a and the width of the electrodes 77 of the conducting strips of the housing 64 are formed to half the width of the coil terminals 46a, 60a, the coil terminals 46a, 60a and the electrodes 77 can be connected without interfering with each other, improving the connection operation.

The present invention is constructed in the above manner and exhibits the effects described below.

According to one aspect of the present invention, there is provided an electric power steering circuit assembly comprising: a motor for outputting an auxiliary torque to a steering wheel of an automobile; a battery for supplying a motor current to drive the motor; a torque sensor for detecting the steering torque of the steering wheel; a vehicle speed sensor for detecting the vehicle speed of the automobile; a power circuit board mounted with a bridge circuit comprising a plurality of semiconductor switching components for switching the motor current according to the required auxiliary torque; a housing having conductor strips insert-molded in insulating resin to form wiring patterns, having a connector for electrical connection to the motor and the battery formed integrally therein, and being mounted with capacitors for absorbing ripple components in the motor current, a coil for preventing the external emission of noise generated by the bridge circuit during the switching operation, a power source relay for connecting and disconnecting the motor current supplied from the battery to the bridge circuit, and a motor relay for connecting and disconnecting the motor current supplied from the bridge circuit to the motor; a control circuit board mounted with a microcomputer and peripheral circuit components for generating a drive signal for controlling the bridge circuit based on the steering torque of the steering wheel and the vehicle speed of the automobile; connecting members disposed in an upright position on the power circuit board having a plurality of terminals for the electrical connection of the power circuit board to the housing and to the control circuit board; and a heat sink, the electric power steering circuit assembly having a layered construction such that the power circuit board is secured in close contact to the heat sink, the housing is secured to the heat sink so as to cover the power circuit board, and the control circuit board is secured to the housing so as to overlap the power circuit board in a vertical direction, and having guides formed in the housing for receiving the connecting members and positioning the housing relative to the power circuit board. Consequently, the circuit board for the mounting of parts is divided into two boards comprising a board for the mounting of small-current parts and a board for the mounting of large-current parts, achieving a reduction in size, and the two boards are disposed above and below with a housing for mounting large parts between and the housing is positioned on the power circuit board by means of guides, providing an electric power steering circuit assembly enabling facilitated assembly.

Because the power circuit board and the housing are secured to the heat sink separately, the step of mounting parts on the power circuit board and the step of mounting parts on the housing can be performed separately, facilitating operations.

Because the edges of the heat sink are formed into inclined surfaces tapered to widen out from top to bottom so that the bottom edges of the metal case for covering and electromagnetically shielding the control circuit board, the housing, and the power circuit board are gradually spread open by the inclined surfaces so as to be mounted on the heat sink in a press-fit condition, the mounting of the case is facilitated and rattling between the case and the heat sink is eliminated, suppressing the generation of noise due to vibrations.

Because the recess for housing the coil is disposed in the vicinity of the connector so as to have an opening on the upper surface or the lower surface and annular protrusions for preventing the adhesive from running are disposed on the bottom of the recess for housing the coil, adhesive does not run during attachment of the coil, improving operations.

Because the recess for housing the capacitors is disposed in the housing so as to have an opening on the opposite side from the opening of the recess for housing the coil and apertures are disposed in the bottom of the recess for housing the capacitors, adhesive can be applied to the coil and the capacitors from the same direction, facilitating operations.

Because the power circuit board and the control circuit board are disposed on one side of the heat sink, the capacitors are mounted in the housing so as to be positioned between the power circuit board and the control circuit board, and the coil, the power relay, and the motor relay are mounted in the housing so as to be positioned on the other side of the heat sink, long capacitors can be disposed sideways, reducing the height of the assembly and enabling a reduction in size.

Because the connections between the terminals of the connecting members and the power relay of the housing and between the terminals of the connecting members and the motor relay of the housing are disposed so as not to overlap the control circuit board in the vertical direction, there is no need to provide insulating space between the control circuit board and the connections, reducing the height of the assembly and enabling a reduction in size.

Because the recess for housing the coil is disposed in the housing so as to have an opening on the upper surface or the lower surface, the capacitor for preventing electrical noise is mounted on the opposite side of the housing from the recess for housing the coil, the wiring patterns are formed by insert-molding the conductor strips partially connected in parts other than the wiring patterns in insulating resin such that the partially-connected redundant portions are exposed, the exposed redundant portions then being cut, and the exposed and cut redundant portions are arranged in a portion between the coil housed in the recess for housing the coil and the capacitor for preventing electrical noise, the adhesive for attaching the coil is prevented from running, improving operations by eliminating adhesion of adhesive to unnecessary parts.

What is claimed is:

1. An electric power steering circuit assembly comprising:
   a motor for outputting an auxiliary torque to a steering wheel of an automobile;
   a battery for supplying a motor current to drive said motor;
   a torque sensor for detecting the steering torque of said steering wheel;
   a vehicle speed sensor for detecting the vehicle speed of said automobile;
   a power circuit board mounted with a bridge circuit comprising a plurality of semiconductor switching components for switching said motor current according to the required auxiliary torque;

a housing having conductor strips insert-molded in insulating resin to form wiring patterns, having a connector for electrical connection to said motor and said battery formed integrally therein, and being mounted with capacitors for absorbing ripple components in said motor current, a coil for preventing the external emission of noise generated by said bridge circuit during said switching operation, a power source relay for connecting and disconnecting said motor current supplied from said battery to said bridge circuit, and a motor relay for connecting and disconnecting said motor current supplied from said bridge circuit to said motor;

a control circuit board mounted with a microcomputer and peripheral circuit components for generating a drive signal for controlling said bridge circuit based on said steering torque of said steering wheel and said vehicle speed of said automobile;

connecting members disposed in an upright position on said power circuit board having a plurality of terminals for the electrical connection of said power circuit board to said housing and to said control circuit board; and a heat sink, said electric power steering circuit assembly having a layered construction such that said power circuit board is secured in close contact to said heat sink, said housing is secured to said heat sink so as to cover said power circuit board, and said control circuit board is secured to said housing so as to overlap said power circuit board in a vertical direction, and having guides formed in said housing for receiving said connecting members and positioning said housing relative to said power circuit board.

2. The electric power steering circuit assembly according to claim 1 wherein said power circuit board and said housing are each separately secured to said heat sink.

3. The electric power steering circuit assembly according to claim 1 wherein the sides of said heat sink are formed into inclined surfaces tapered to widen out from top to bottom, the bottom edges of a metal case for covering and electromagnetically shielding said control circuit board, said housing, and said power circuit board being gradually spread open by said inclined surfaces so as to be mounted on said heat sink in a press-fit condition.

4. The electric power steering circuit assembly according to claim 1 wherein said power circuit board and said control circuit board are disposed on one side of said heat sink, said capacitors are mounted in said housing so as to be positioned between said power circuit board and said control circuit board, and said coil, said power relay, and said motor relay are mounted in said housing so as to be positioned on the other side of said heat sink.

5. The electric power steering circuit assembly according to claim 1 wherein the connections between said terminals of said connecting members and said power relay of said housing and between said terminals of said connecting members and said motor relay of said housing are disposed so as not to overlap said control circuit board in the vertical direction.

6. The electric power steering circuit assembly according to claim 1 wherein:

a recess for housing said coil is disposed in said housing so as to have an opening on the upper surface or the lower surface;

a capacitor for preventing electrical noise is mounted on the opposite side of said housing from said recess for housing said coil;

said wiring patterns are formed by insert-molding said conductor strips partially connected in parts other than said wiring patterns in insulating resin such that partially-connected redundant portions are exposed, said exposed redundant portions then being cut; and said exposed and cut redundant portions are arranged in a portion between said coil housed in said recess for housing said coil and said capacitor for preventing electrical noise.

7. The electric power steering circuit assembly according to claim 1 wherein said recess for housing said coil is disposed in the vicinity of said connector of said housing so as to have an opening on the upper surface or the lower surface, and annular protrusions for preventing adhesive from running are disposed on the bottom of said recess for housing said coil.

8. The electric power steering circuit assembly according to claim 7 wherein said recess for housing said capacitors is disposed in said housing so as to have an opening on the opposite side from said opening of said recess for housing said coil, and apertures are disposed in the bottom of said recess for housing said capacitors.

9. The electric power steering circuit assembly according to claim 8 wherein said power circuit board and said control circuit board are disposed on one side of said heat sink, said capacitors are mounted in said housing so as to be positioned between said power circuit board and said control circuit board, and said coil, said power relay, and said motor relay are mounted in said housing so as to be positioned on the other side of said heat sink.

10. The electric power steering circuit assembly according to claim 9 wherein the connections between said terminals of said connecting members and said power relay of said housing and between said terminals of said connecting members and said motor relay of said housing are disposed so as not to overlap said control circuit board in the vertical direction.

\* \* \* \* \*